(12) United States Patent
Sasaki et al.

(10) Patent No.: US 7,357,650 B2
(45) Date of Patent: Apr. 15, 2008

(54) ELECTRICAL CONNECTION BOX

(75) Inventors: Yoshikazu Sasaki, Yokkaichi (JP);
Yukinori Kita, Yokkaichi (JP)

(73) Assignees: Autoneworks Technologies, Ltd., Mie (JP); Sumitomo Wiring Systems, Ltd., Mie (JP); Sumitomo Electric Industries, Inc., Osaka (JP)

( * ) Notice: Subject to any disclaimer, the term of this patent is extended or adjusted under 35 U.S.C. 154(b) by 75 days.

(21) Appl. No.: 11/510,700

(22) Filed: Aug. 28, 2006

(65) Prior Publication Data

US 2007/0054523 A1      Mar. 8, 2007

(30) Foreign Application Priority Data

Sep. 2, 2005   (JP) .............................. 2005-254634
Oct. 14, 2005  (JP) .............................. 2005-300628

(51) Int. Cl.
  *H01R 12/00* (2006.01)
(52) U.S. Cl. ...................... 439/76.2; 439/190
(58) Field of Classification Search ............... 439/76.2, 439/190, 191
  See application file for complete search history.

(56) References Cited

U.S. PATENT DOCUMENTS

| 6,761,567 | B2* | 7/2004 | Onizuka et al. ........... 439/76.2 |
| 6,796,809 | B2* | 9/2004 | Kakuta et al. ............. 439/76.2 |
| 7,291,024 | B2* | 11/2007 | Kiyota et al. ............. 439/76.2 |
| 2002/0061666 | A1* | 5/2002 | Sato ........................ 439/76.2 |
| 2003/0137813 | A1 | 7/2003 | Onizuka et al. |
| 2004/0001319 | A1 | 1/2004 | Kawakita et al. |
| 2004/0214458 | A1* | 10/2004 | Maebashi ................... 439/76.2 |
| 2005/0186811 | A1* | 8/2005 | Lee et al. ................. 439/76.2 |
| 2006/0024992 | A1* | 2/2006 | Kanazawa ................. 439/76.2 |
| 2006/0030175 | A1* | 2/2006 | Yamane ..................... 439/76.2 |
| 2006/0216968 | A1* | 9/2006 | Maebashi ................... 439/76.2 |

FOREIGN PATENT DOCUMENTS

| JP | A 10-35375 | 2/1998 |
| JP | A 2003-164039 | 6/2003 |
| JP | A 2004-40873 | 2/2004 |

* cited by examiner

*Primary Examiner*—Gary F. Paumen
(74) *Attorney, Agent, or Firm*—Oliff & Berridge, PLC

(57) ABSTRACT

A bulging wall portion, which forms a connector accommodation portion by bulging outward from a side wall, is formed in a cover plate portion of a cover. The bulging wall portion has an overhead wall formed such that it rises from the cover plate portion. A sloping wall is formed on the overhead wall such that roughly the center in the width direction of the connector accommodation portion serves as a vertex and the sloping wall slopes in downward gradients from the vertex toward both ends in the width direction. Water that flows down over the cover plate portion is caught by the overhead wall and flows downward along the sloping wall. The water is guided to both side faces on the outer sides in the width direction of the connector accommodation portion, so that it is drained off while avoiding the opening portions of the second through fourth connectors.

19 Claims, 8 Drawing Sheets

ELECTRICAL CONNECTION BOX

CROSS REFERENCE TO RELATED APPLICATION

This application claims priority from Japanese Patent Application No. 2005-254634 filed Sep. 2, 2005, and Japanese Patent Application No. 2005-300628 filed Oct. 14, 2005. The entire content of these priority applications is incorporated herein by reference.

TECHNICAL FIELD

This disclosure relates to an electrical connection box.

BACKGROUND

The electrical connection box described in Japanese Patent Application Publication No. JP-2004-040873-A (FIG. 6) has been known for some time as an electrical connection box that is mounted in an automobile. It discloses a circuit board on which an electrical circuit is formed and which is positioned in a case. On a lower portion of a side wall of the case, a portion that bulges outward is formed which includes a connector. Within the connector accommodation portion, a connector that is open at the bottom is included.

With this kind of electrical connection box, water that forms on the top side (as a result of dewing or the like) sometimes flows down along an outer side face of a side wall of the case. Water that flows down the side wall reaches the connector accommodation portion, then flows farther down and reaches the bottom edge of the connector accommodation portion. Because the connector is open at the bottom edge of the connector accommodation portion, there is concern that the water might penetrate into the case via the opening and short out the electrical circuit, which makes up a circuit assembly.

SUMMARY

The present invention has been completed in view of the circumstances described above. It is an object of the present invention to provide an electrical connection box in which penetration of water into the interior of the case can be avoided.

The present invention provides an electrical connection box that includes a circuit board inside a case that has a side wall, comprising a connector provided with an opening facing downward toward a bottom side of the case; and a sloping wall that is formed on an outer surface of the side wall such that it has a length dimension in the left-right direction that is greater than the width dimension of the connector and spans the entire width of the connector and that slopes downward toward at least one of the two ends of the connector in the width direction.

According to the present invention, water that flows downward from the upper portion of the case over the outer surface of the side wall is caught by a sloping wall. The sloping wall slopes downward toward at least one of the left and right ends in the width direction of the connector, so the water flows downward along the slope and is guided to the outside of the connector in the width direction. Water that flows down the side wall of the case is thus drained off while avoiding an opening of the connector, so that penetration of water into the interior of the case can be avoided.

BRIEF DESCRIPTION OF THE DRAWINGS

Illustrative aspects in accordance with the present invention will be described in detail with reference to the following figures, wherein.

DETAILED DESCRIPTION

First Illustrative Aspect

Figure 1:
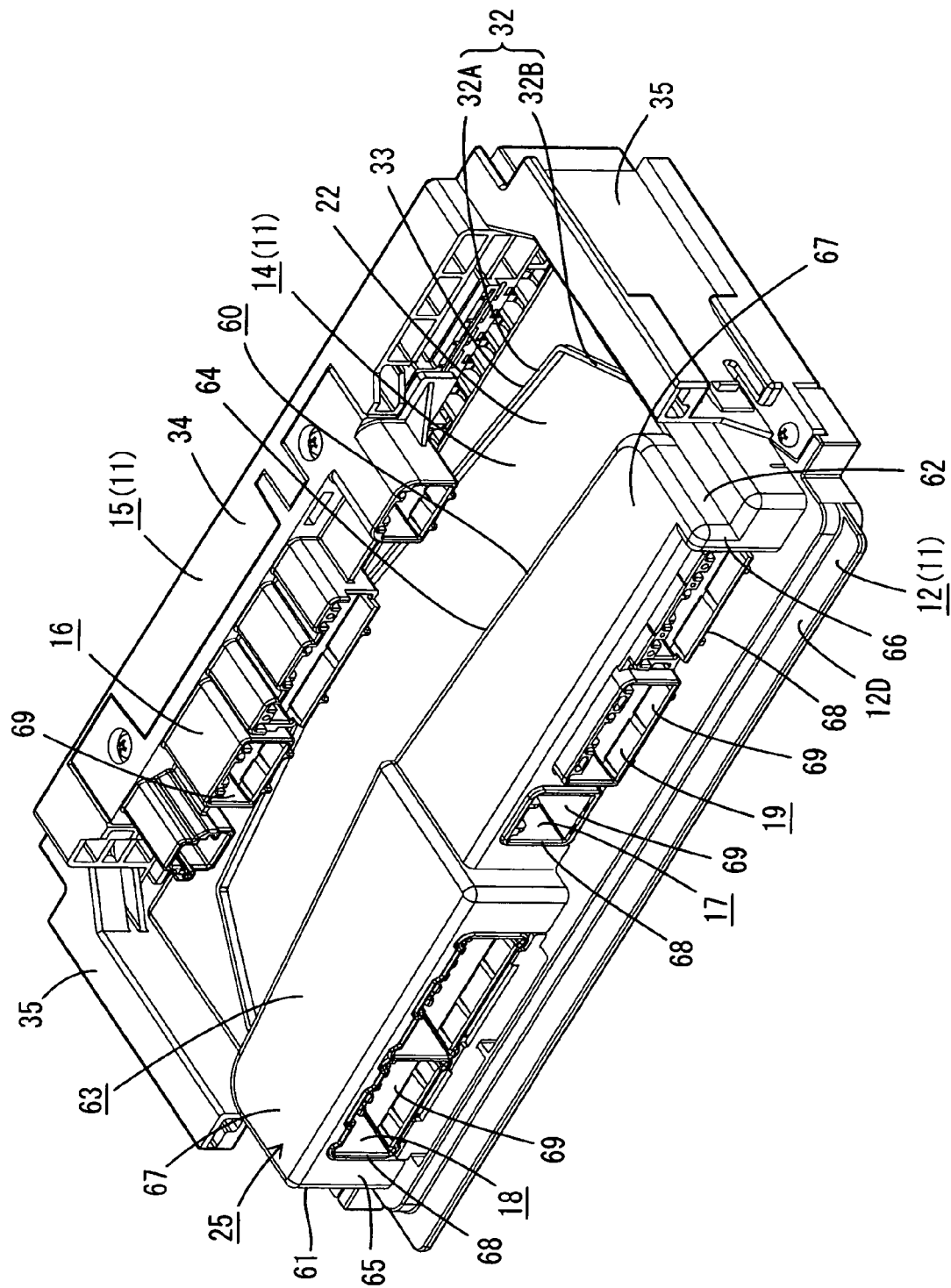
FIG. 1 is an oblique perspective view of an entire electrical connection box in accordance with a first aspect of the present invention.
Figure 2:
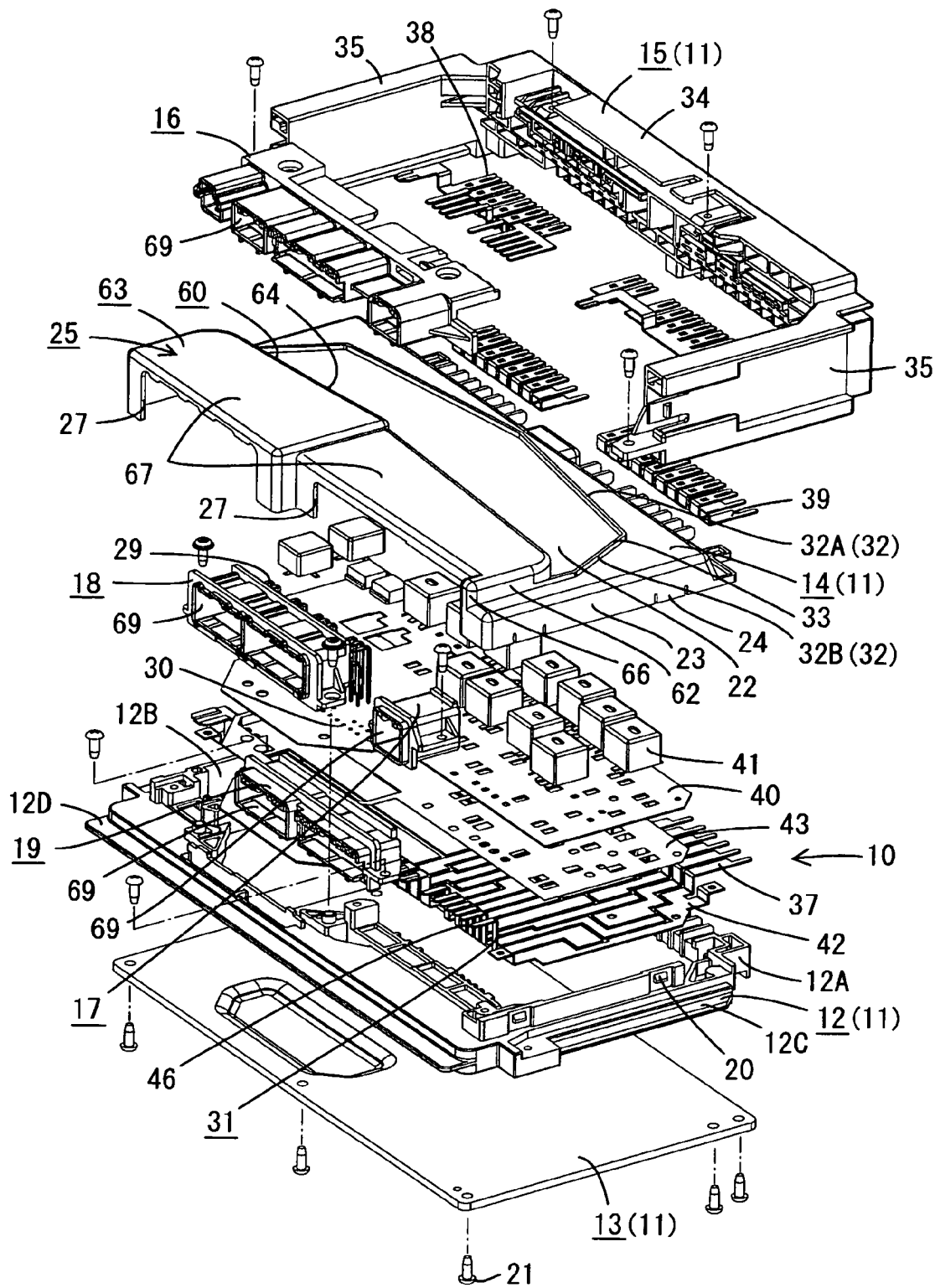
FIG. 2 is an exploded oblique perspective view of the electrical connection box in accordance with the first aspect of the present invention.
Figure 3:
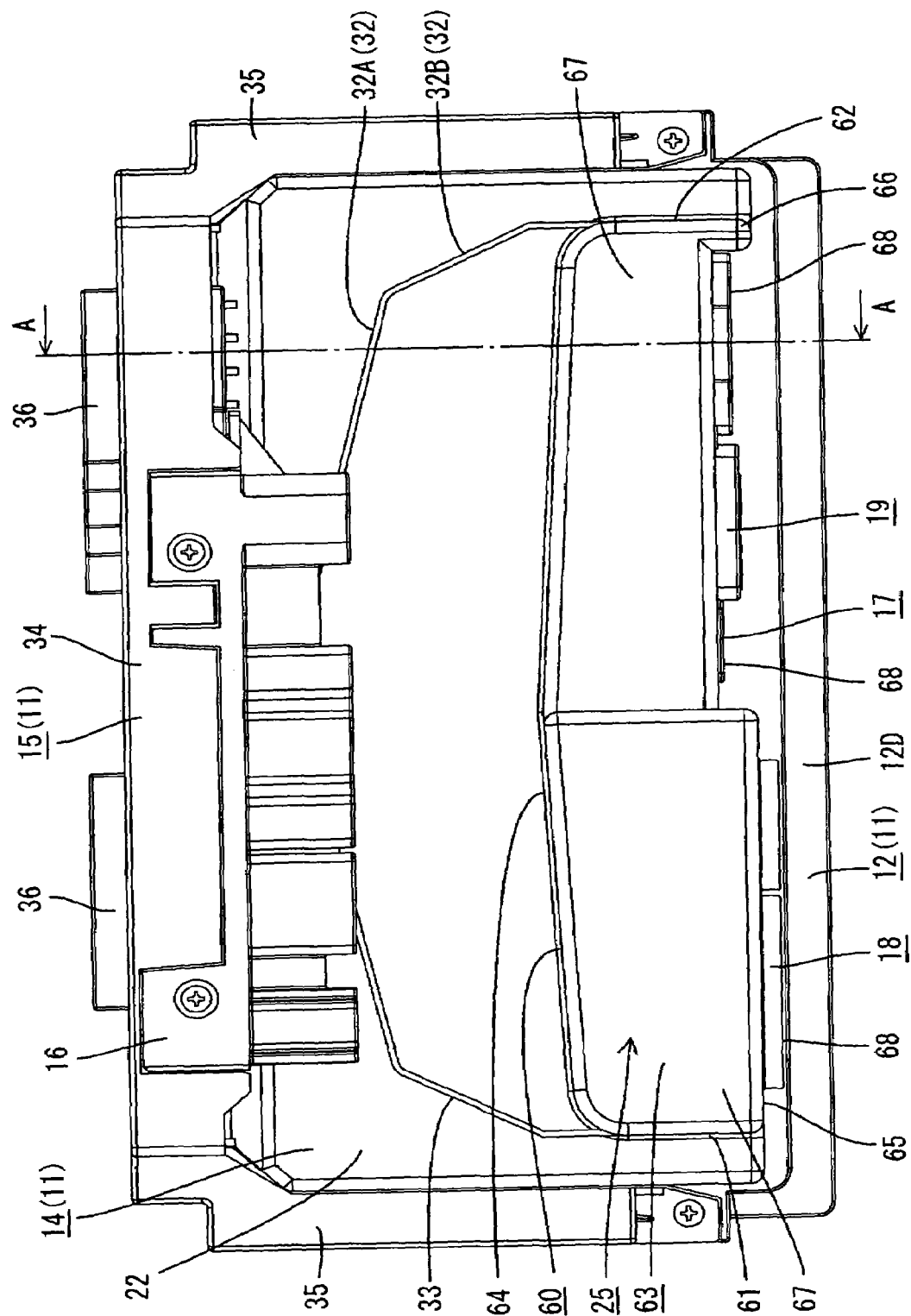
FIG. 3 is a front view of the electrical connection box in accordance with the first aspect of the present invention.
Figure 4:
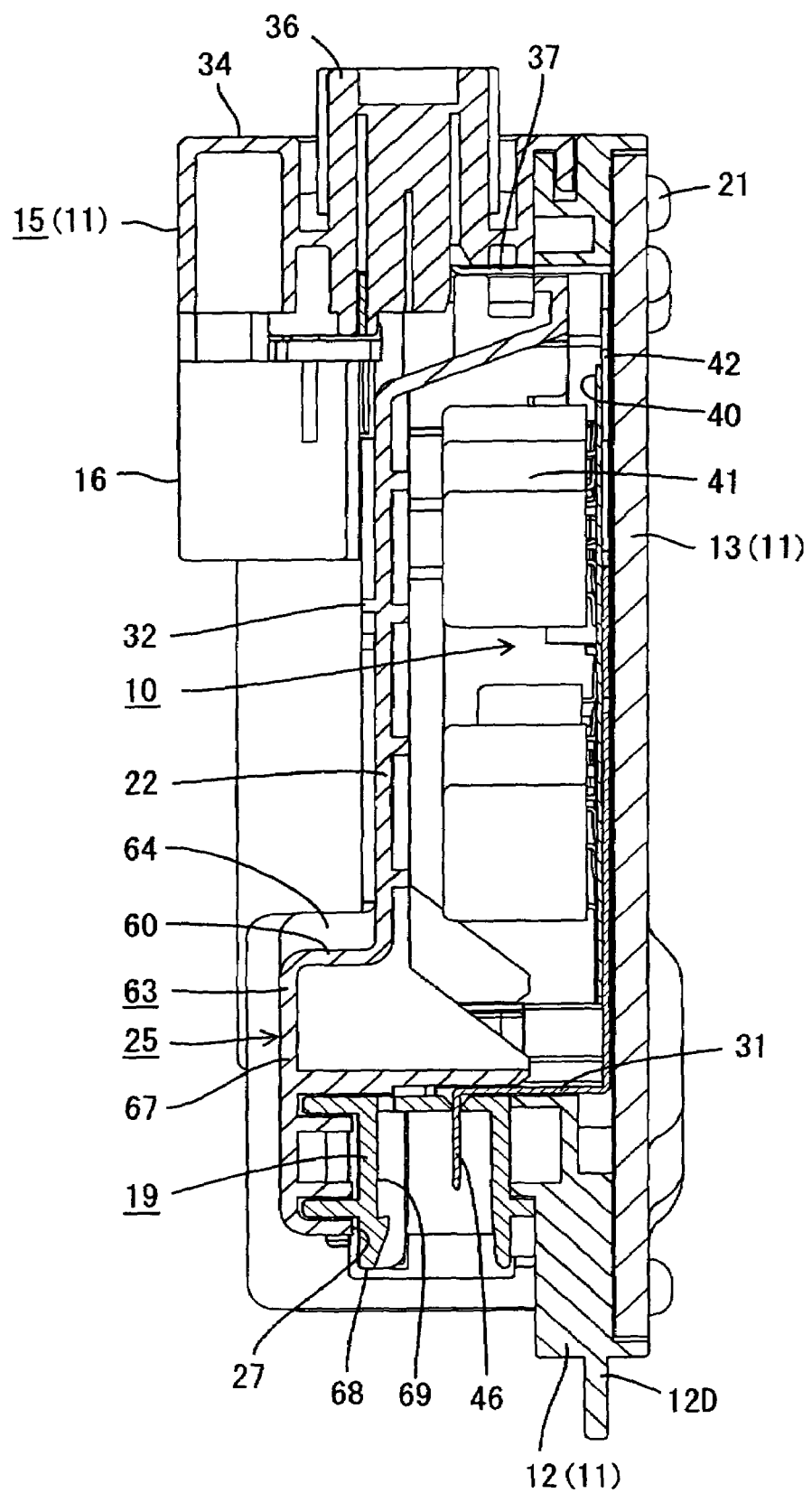
FIG. 4 is a sectional view along the line A-A in FIG. 3.
Figure 5:
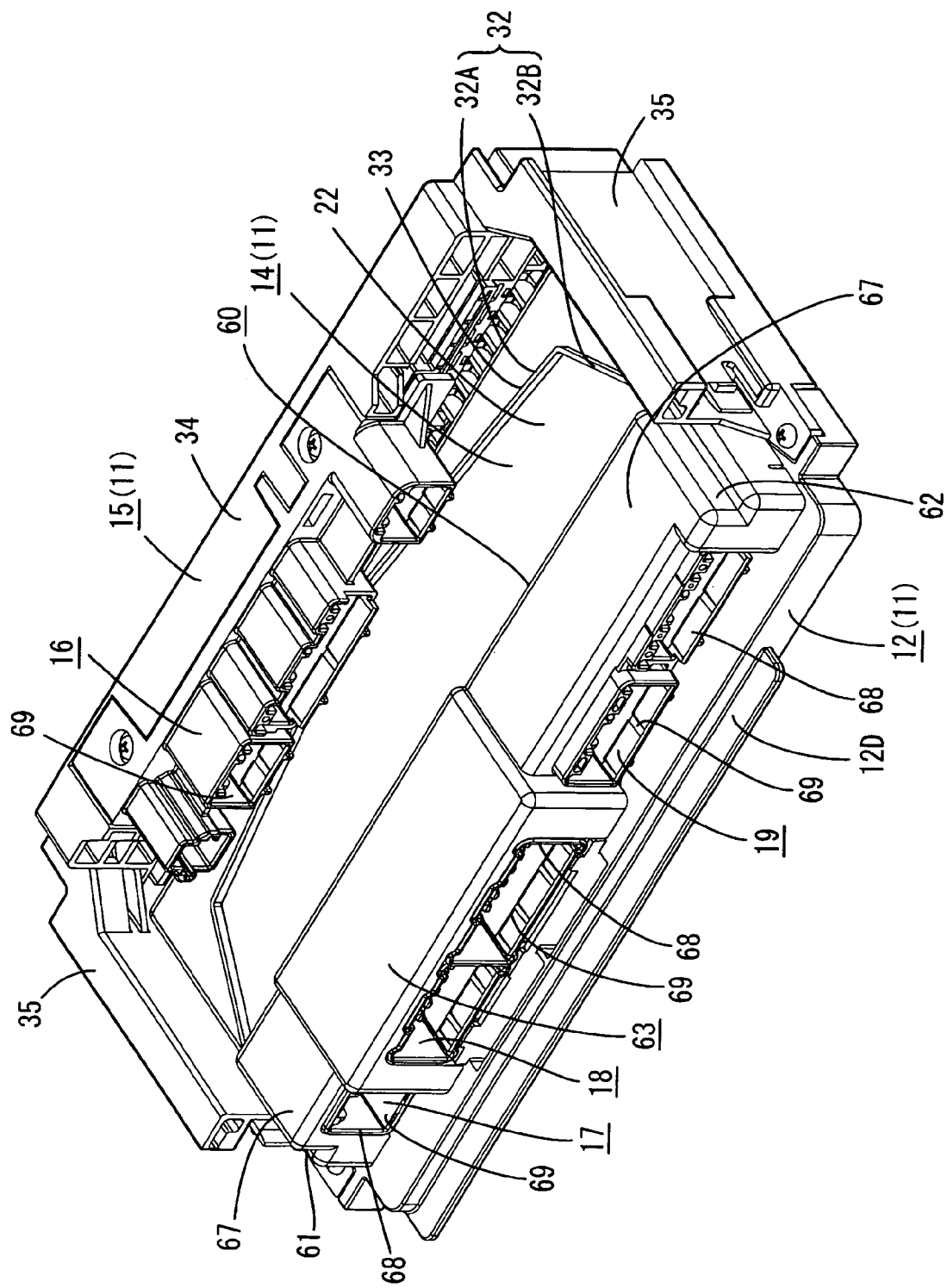
FIG. 5 is an oblique perspective view of an entire electrical connection box in accordance with a second aspect of the present invention.
Figure 6:
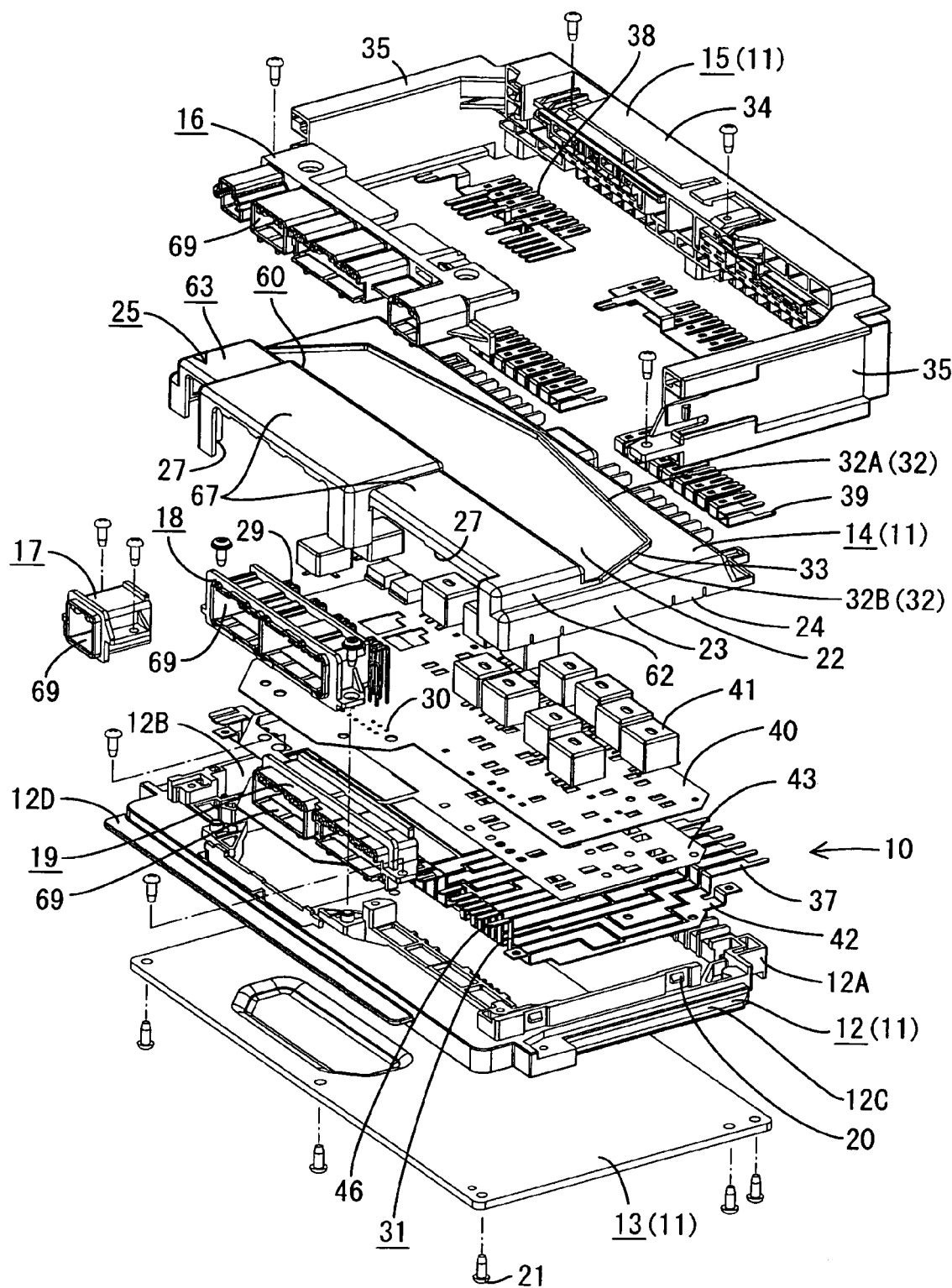
FIG. 6 is an exploded oblique perspective view of the electrical connection box in accordance with a second aspect of the present invention.
Figure 7:
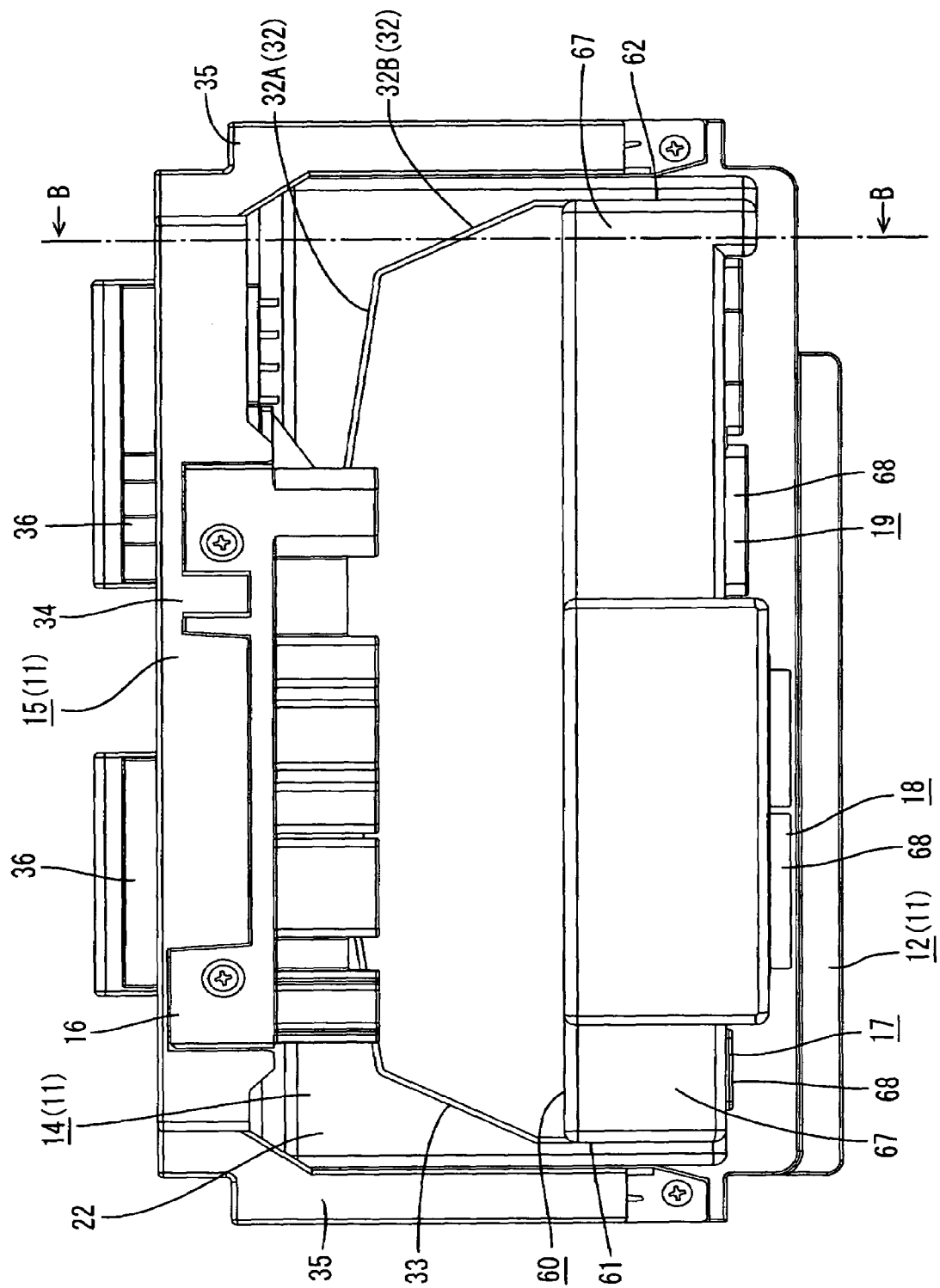
FIG. 7 is a front view of the electrical connection box in accordance with a second aspect of the present invention.

A first illustrative aspect is explained with reference to FIG. 1 through FIG. 4. In this illustrative aspect, an electrical connection box is mounted in a vehicle. The electrical connection box is positioned between a power supply (not illustrated) and electrical equipment such as lamps, audio, and the like (not illustrated), and it controls the switching on and off of electric power to each piece of equipment. The electrical connection box includes a circuit board 10 within a case 11 that forms a flat shape. In FIG. 1 and FIG. 2, the electrical connection box is drawn so that its obverse side faces upward, but in its installed state in a vehicle, the electrical connection box is arranged vertically such that the board plane of the circuit board 10 is vertical, as shown in FIG. 4. Hereinafter, the up-down and left-right orientations are explained using the installed state in a vehicle as the reference.

The case 11 includes a frame 12, a heat sink 13, a cover 14, a fuse block 15, a first connector 16, and second through fourth connectors 17, 18, and 19. The frame 12 is made of synthetic resin and is open in both the front and rear directions (the left and right directions in FIG. 4). The heat sink 13 is made of metal and is attached to the frame 12 such that it covers the opening on the reverse side of the frame 12 (the right side in FIG. 4). The cover 14 is made of synthetic resin and is attached to the frame 12 such that it covers the opening on the obverse side of the frame 12 (the left side in FIG. 4). The fuse block 15 is made of synthetic resin and is attached to the frame 12 from the upper side of the frame 12. The first connector 16 is made of synthetic resin and is attached to the fuse block 15. The second through fourth connectors 17, 18, and 19 are made of synthetic resin and are attached to the bottom edge portion of the frame 12.

The frame 12 is roughly rectangular in shape and includes an upper frame portion 12A, a left frame portion 12B and a right frame portion 12C, which extend from the left and right ends, respectively, of the upper frame portion 12A, and a lower frame portion 12D, which is joined to the bottom ends of the left frame portion 12B and the right frame portion 12C. Outward-projecting lock projections 20 are formed on the outer side faces of the left frame portion 12B and the right frame portion 12C.

The heat sink 13, which is attached to the reverse side of the frame 12, is roughly rectangular in shape and roughly similar in shape to the outline of the frame 12. The heat sink 13 is fixed to the reverse face of the frame 12 by means of adhesive (not illustrated) and is secured in place by a bolt 21.

The cover 14 is shaped overall like a shallow plate that is open to the reverse side and is roughly similar in shape to the outline of the frame 12. The cover 14 includes a cover plate portion 22 (corresponding to a side wall of the present invention), which covers the opening on the obverse side of the frame 12, and side walls 23, which project toward the reverse side along outside edges of the cover plate portion 22. Receiving portions 24 are formed on the side walls 23 of the cover 14 in positions corresponding to the lock projections 20 on the frame 12. The cover 14 becomes attached to the frame 12 from the obverse side by elastically engaging the receiving portions 24 and the lock projections 20. The cover plate portion 22 of the cover 14 is arranged such that it is roughly parallel to the board plane of the circuit board 10.

In a lower portion of the cover 14, a bulging wall portion 63 is formed that bulges toward the obverse side (the left side in FIG. 4) across all but the left and right end portions of the cover 14. An interior portion of the bulging wall portion 63 serves as a connector accommodation portion 25 (corresponding to an accommodation portion of the present invention). Two openings 27 are provided in the bottom face of the connector accommodation portion 25. The second through fourth connectors 17, 18, and 19 are arranged in the openings 27 such that the second through fourth connectors 17, 18, and 19 close the openings 27. Each of the second through fourth connectors 17, 18, and 19 has an opening portion 69 that opens facing downward. A mating connector (not illustrated) is connected within each of the opening portions 69. The second through fourth connectors 17, 18, and 19, each of which must be of a prescribed height in order for its mating connector to be connected, can be accommodated within the connector accommodation portion 25 without increasing the height dimension of the electrical connection box in the front-back direction.

The third connector 18 is mounted on the circuit board 10. One end of a bar-shaped terminal fitting 29 is inserted into a top portion of the third connector 18 from above. An other end of the terminal fitting 29 is bent toward the reverse side at approximately a right angle and, by being inserted into a through-hole 30 that is formed in the circuit board 10, is connected to an electric circuit that is formed in the circuit board 10. Lower ends of lower side projecting portions 31, described below, are inserted into the fourth connector 19 from above and serve as connector terminals 46, described below.

On the outer surface of the cover plate portion 22 of the cover 14, a ridge 32 (corresponding to a sloping wall in the present invention) is formed such that it rises in the obverse side direction (to the left in FIG. 4) in a position that is slightly lower than a top edge of the cover plate portion 22 and higher than the connector accommodation portion 25. The ridge 32 extends continuously as a rib shape in the left-right direction (the width direction), forming a vertex roughly in the center of the left-right direction and sloping in downward gradients from the vertex toward the left and right edges of the cover plate portion 22. The portions of the ridge 32 from the vertex to positions slightly to the inside of positions corresponding to the left and right edges of the connector accommodation portion 25 constitute gently sloping portions 32A, which have gentle downward gradients in relation to the horizon. The portions of the ridge 32 to the outside of the gently sloping portions 32A constitute steeply sloping portions 32B, which have steep downward gradients. The upper face of the ridge 32 thus forms a sloping face 33, which has a vertex roughly in the center of the left-right direction and slopes in downward gradients from the vertex toward the left and right.

The length dimension of the sloping face 33 (in the left-right direction) is greater than the collective width dimension of the second through fourth connectors 17, 18, and 19 when the second through fourth connectors 17, 18, and 19 are accommodated within the connector accommodation portion 25, the sloping face 33 being formed such that it spans the entire width of the connectors 17, 18, and 19.

The bottom ends of the steeply sloping portions 32B are connected to the upper edges of the left and right ends of the connector accommodation portion 25. The ends of the ridge 32 are thus continuous with the left and right side faces on the outer sides of the connector accommodation portion 25 in the width direction. The steeply sloping portions 32B, where the angle of inclination of the ridge 32 in relation to the horizon is greatest, are thus continuous with both side faces on the outer sides of the connector accommodation portion 25. The gently sloping portions 32A, where the angle of inclination is smaller than in the steeply sloping portions 32B, are formed such as to be continuous with the steeply sloping portions 32B and to extend toward roughly the center of the width direction of the connector accommodation portion 25.

The fuse block 15 includes a long and narrow main body portion 34, which is arranged along a top edge portion of the frame 12 and projects farther forward than the cover 14, and a pair of arm portions 35, which are shaped like cantilevers and extend downward from the left and right ends of the main body portion 34.

Two fuse accommodation portions 36, left and right, to accommodate fuses (not illustrated), are formed in the top side of the main body portion 34. The accommodation portions 36 are formed such that they project in a rectangular block shape from the top side of the main body portion 34 and are open on the top. Upper ends of upper side projecting portions 37 are inserted into the main body portion 34 from below.

The first connector 16 is attached to the portion of the fuse block 15 that projects toward the obverse side. An opening portion 69 that opens facing downward is formed in the first connector 16. An external connector (not illustrated) can fit into the opening portion 69. Roughly the bottom halves of terminal fittings 38 are accommodated within the opening portion 69, and roughly the top halves of the terminal fittings 38 are inserted into the main body portion 34 from below. The terminal fittings 38 and the upper side projecting portions 37 are connected in the main body portion 34 via fuses and relay terminals 39.

In the circuit board 10, a control circuit is formed by a print wiring method on the obverse side (the left side in FIG. 4) of a roughly rectangular insulating substrate. The control circuit is configured by mounting switching elements 41, such as relays and the like, on the circuit board 10. On the reverse side (the right side in FIG. 4) of the insulating substrate 40, a plurality of bus bars 42 are arranged in a state of electrical connection with the control circuit. The bus bars 42 are bonded to the reverse side of the insulating substrate 40 via an adhesive sheet 43. The circuit board 10 is positioned within the case 11 such that the board plane is oriented vertically. The upper side projecting portions 37, which are formed on ends of the bus bars 42, protrude side by side in a row from the top edge of the insulating substrate 40. The lower side projecting portions 31, which are formed on ends of the bus bars 42 in the same way, protrude side by side in a row from the bottom edge of the insulating substrate 40 (the area in the right half of FIG. 4). The circuit board 10 is bonded to the obverse face of the heat sink 13 by means of an adhesive (not illustrated) that is applied to the reverse faces of the bus bars 42.

The lower side projecting portions 31 are formed such that they are bent into crank shapes toward the obverse side of the board plane of the circuit board 10. Their lower ends thus project downward and serve as the connector terminals 46, which can be connected to mating connectors by being inserted into the fourth connector 19 from above.

The bulging wall portion 63, which forms the connector accommodation portion 25, includes an overhead wall 60, a front wall 67, a left side wall 61, and a right side wall 62. The overhead wall 60 is formed such that it projects forward from the cover plate portion 22. The front wall 67 hangs straight down from the forward edge of the overhead wall 60. The left side wall 61 and the right side wall 62 hang straight down from the left and right edges, respectively, of the overhead wall 60, as shown in FIG. 3. The outer side faces of the left and right side walls 61 and 62 of the bulging wall portion 63 form the outer sides of the connector accommodation portion 25 in the width direction. The front wall 67 forms a side face of the connector accommodation portion 25 that is orthogonal to the thickness direction (the front-back direction) of the electrical connection box.

The upper face of the overhead wall 60 is formed such that roughly the center position of the overhead wall 60 in the left-right direction (the width direction) serves as a vertex and the upper face of the overhead wall 60 slopes in downward gradients from the vertex toward the left and right ends of the overhead wall 60 such that the upper face of the overhead wall 60 serves as a sloping wall 64. The left and right ends of the overhead wall 60 and the upper ends of the left and right side walls 61 and 62 are formed such that they form continuous curves at their respective ends. The length dimension of the sloping wall 64 (in the left-right direction) is greater than the collective width dimension of the second through fourth connectors 17, 18, and 19 when the second through fourth connectors 17, 18, and 19 are accommodated within the connector accommodation portion 25, the sloping wall 64 being formed such that it spans the entire width of the connectors 17, 18, and 19.

A separator portion 65 is formed between the lower end of the left side wall 61 and an opening edge portion 68 of the third connector 18 to separate the lower end of the left side wall 61 from the opening edge portion 68. The separator portion 65 prevents any water that moves to the lower end of the left side wall 61 from flowing around to the opening portion 69 of the third connector 18.

An overhanging portion 66 that hangs downward is formed at the lower end of the right side wall 62. The lower end of the overhanging portion 66 is formed such that it is in a lower position than opening edge portions 68 of the second and fourth connectors 17 and 19.

Next, the operation and effects of the electrical connection box in this illustrative aspect are explained.

In the electrical connection box, water sometimes forms on the top of the case 11 as a result of dewing or the like. The water flows downward from the upper portion of the case 11 over the outer surface of the cover plate portion 22. When this happens, the water is first caught by the upper face of the ridge 32, which is formed such that it rises from the outer surface of the cover plate portion 22. The upper face of the ridge 32 thus forms the sloping face 33, which has a vertex roughly in the center of the left-right direction and slopes in downward gradients from the vertex toward its left and right ends. The left and right ends of the sloping face 33 are also continuous with the left and right side faces on the outer sides of the connector accommodation portion 25 in the left-right direction. The water therefore flows down the sloping face 33 and moves to the left and right side faces on the outer sides of the connector accommodation portion 25, that is, to the left and right side walls 61 and 62 of the bulging wall portion 63.

The water that flows down from above the ridge 32 is caught by the ridge 32, which reduces the amount of water that flows down to the connector accommodation portion 25, which is positioned below the ridge 32. This inhibits the penetration of water from the opening portions 69 into the second through fourth connectors 17, 18, and 19, which are accommodated within the connector accommodation portion 25.

The water that flows down to the upper face of the ridge 32 flows down from the left and right ends of the ridge 32, so even when a large amount of water flows down to the upper face of the ridge 32, the water is prevented from overflowing the ridge 32 and flowing down the outer surface of the front wall 67 of the connector accommodation portion 25. This further avoids the penetration of water from the openings into the second through fourth connectors 17, 18, and 19.

In the ridge 32, the steeply sloping portions 32B, where the angle of inclination in relation to the horizon is greatest, are continuous with both side faces on the outer sides of the connector accommodation portion 25. The gently sloping portions 32A, where the angle of inclination is smaller than in the steeply sloping portions 32B, are formed such as to be continuous with the steeply sloping portions 32B and to extend toward roughly the center of the width direction of the connector accommodation portion 25. This configuration allows the gently sloping portions 32A to be formed on the upper portion of the cover plate portion 22. The gently sloping portions 32A can thus reliably catch the water that flows down over the cover plate portion 22 before the flow velocity increases. As a result, overflowing of the downward-flowing water from the ridge 32 can be reliably prevented.

The water that flows down to the upper face of the ridge 32 is guided by the sloping face 33 to the left and right side walls 61 and 62. The water that flows down the left side wall 61 arrives at the lower end of the left side wall 61. The separator portion 65 is formed at the lower end of the left side wall 61, which prevents the water from flowing around to the opening portion 69 of the third connector 18.

The water that flows down the right side wall 62 arrives at the lower end of the right side wall 62. The overhanging portion 66 is formed at the lower end of the right side wall 62. The water is guided to the overhanging portion 66 and moves downward, dropping downward from the lower end of the overhanging portion 66. The lower end of the overhanging portion 66 is positioned lower than the opening edge portions 68 of the second and fourth connectors 17 and 19, which prevents the water from flowing around to the opening portions 69 of the second and fourth connectors 17 and 19. Also, the separator portion 65 can be omitted from the right side, so the width of the electrical connection box can be reduced.

In the electrical connection box in this illustrative aspect, the bulging wall portion 63 that is formed in the cover 14 is used as the connector accommodation portion 25 to give the box a lower profile, and the second through fourth connectors 17, 18, and 19 are accommodated within the connector accommodation portion 25. As a result, there is no space available between the lower edge of the front wall 67 of the bulging wall portion 63 and the opening portions 69 of the second through fourth connectors 17, 18, and 19 to provide a separator portion 65 or an overhanging portion 66 to prevent the water that moves to the lower edge of the front wall 67 from flowing around to the opening portions 69 of the second through fourth connectors 17, 18, and 19. There is therefore a risk that if water adheres to the front wall 67 and moves to the lower edge of the front wall 67, the water will penetrate into the second through fourth connectors 17, 18, and 19 from the opening portions 69.

In light of this point, the overhead wall 60 of the bulging wall portion 63 that forms the connector accommodation portion 25 is formed such that it projects outward from the cover plate portion 22. The overhead wall 60 is configured such that it forms the sloping wall 64, in which the approximate center position in the left-right direction serves as a vertex and which slopes in downward gradients from the vertex toward the left and right ends of the overhead wall 60. As a result, in the region of the cover plate portion 22 that is below the ridge 32 and above the connector accommodation portion 25, water that adheres as a result of dewing or the like flows down the outer surface of the cover plate portion 22, reaches the overhead wall 60 of the bulging wall portion 63 that forms the connector accommodation portion 25, and is caught by the overhead wall 60, which is formed such that it projects outward from the cover plate portion 22. The water flows down along the sloping wall 64, flows down from the left and right ends of the overhead wall 60, moves to the left and right side walls 61 and 62 of the bulging wall portion 63, and drops off. Water that flows down to the overhead wall 60 thus does not adhere to the front wall 67, so the penetration of water into the second through fourth connectors 17, 18, and 19 from the opening portions 69 can be prevented. Even when a large amount of water flows down to the overhead wall 60, the water flows down from the left and right ends of the overhead wall 60, so the water can be prevented from overflowing from the overhead wall 60 and flowing down to the front wall 67. As described above, when the water arrives at the lower ends of the left and right side walls 61 and 62 of the bulging wall portion 63, the separator portion 65 and the overhanging portion 66 prevent the water from penetrating into the second through fourth connectors 17, 18, and 19 from the opening portions 69.

Second Illustrative Aspect

Figure 8:
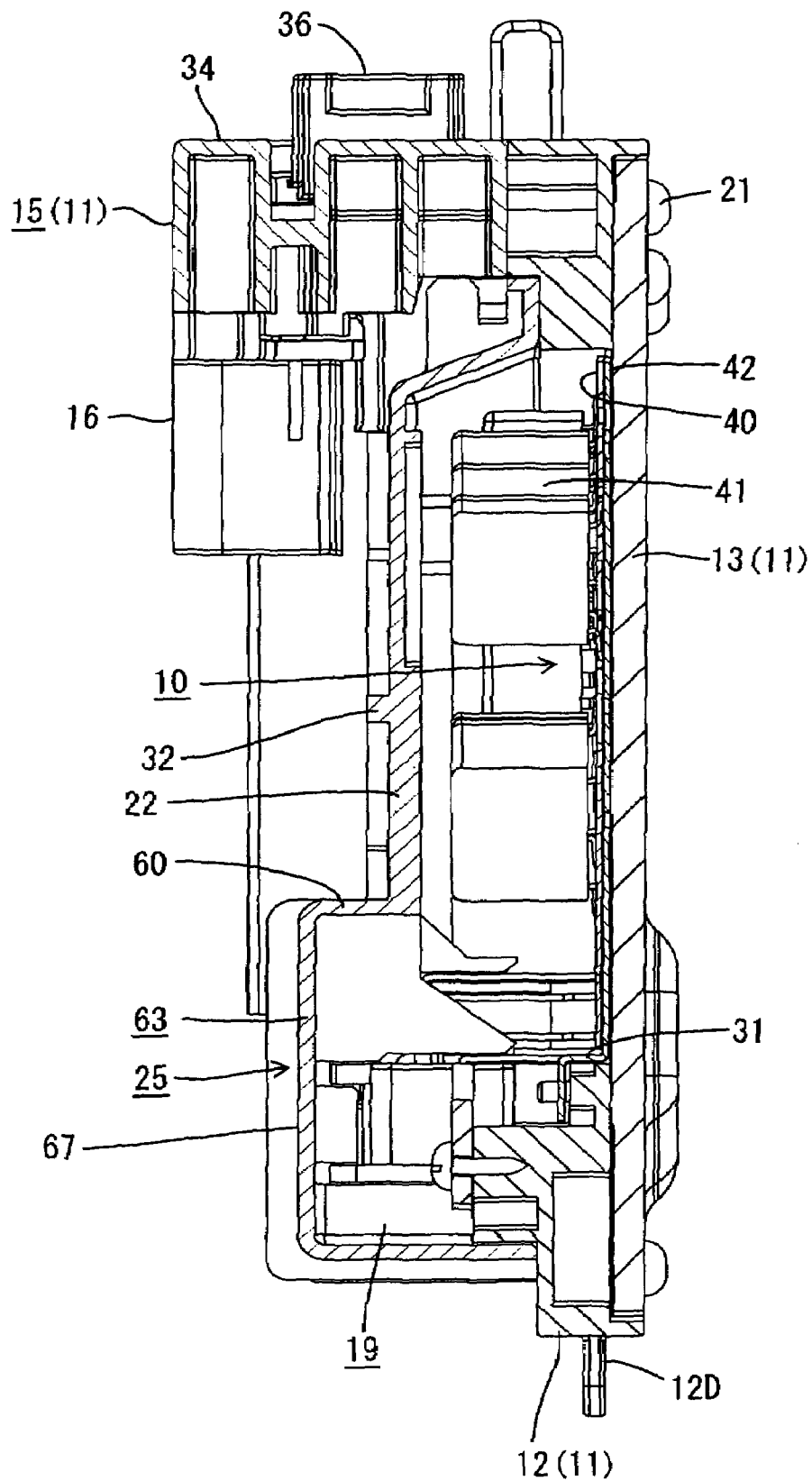
FIG. 8 is a sectional view along the line B-B in FIG. 7.

In a second illustrative aspect, in a lower portion of a cover 14, a bulging wall portion 63 is formed that bulges toward the obverse side (the left side in FIG. 8) across all but the left and right end portions of the cover 14. An interior portion of the bulging wall portion 63 serves as a connector accommodation portion 25. Three openings 27 are provided in the bottom face of the connector accommodation portion 25. Second through fourth connectors 17, 18, and 19 are arranged in the openings 27 such that the second through fourth connectors 17, 18, and 19 close the openings 27. An overhead wall 60 of the bulging wall portion 63 is formed such that its upper face is roughly horizontal.

All other structures in this illustrative aspect are roughly the same as in the first illustrative aspect of the present invention described above. Identical symbols are used for identical portions, and explanations of identical portions are omitted.

Next, the operation and effects are explained. In the electrical connection box, water sometimes forms on the top of the case 11 as a result of dewing or the like. The water flows downward from the top of the case 11 over the outer surface of the cover plate portion 22. When this happens, the water is first caught by the upper face of the ridge 32, which is formed such that it rises from the outer surface of the cover plate portion 22. The upper face of the ridge 32 thus forms the sloping face 33, which has a vertex roughly in the center of the left-right direction and slopes in downward gradients from the vertex toward its left and right ends. The left and right ends of the sloping face 33 are also continuous with the left and right side faces on the outer sides of the connector accommodation portion 25 in the left-right direction. The water therefore flows down the sloping face 33 and moves to the left and right side faces on the outer sides of the connector accommodation portion 25, that is, to the left and right side walls 61 and 62 of the bulging wall portion 63.

The water that flows down from above the ridge 32 is caught by the ridge 32, which reduces the amount of water that flows down to the connector accommodation portion 25, which is positioned below the ridge 32. This inhibits the penetration of water from the opening portions 69 into the second through fourth connectors 17, 18, and 19, which are accommodated within the connector accommodation portion 25.

The water that flows down to the upper face of the ridge 32 flows down from the left and right ends of the ridge 32, so even when a large amount of water flows down to the upper face of the ridge 32, the water is prevented from overflowing the ridge 32 and flowing down the outer surface of the front wall 67 of the connector accommodation portion 25. This further avoids the penetration of water from the openings into the second through fourth connectors 17, 18, and 19.

In the ridge 32, the steeply sloping portions 32B, where the angle of inclination in relation to the horizon is greatest, are continuous with both side faces on the outer sides of the connector accommodation portion 25 in the width direction. The gently sloping portions 32A, where the angle of inclination is smaller than in the steeply sloping portions 32B, are formed such as to be continuous with the steeply sloping portions 32B and to extend toward roughly the center of the width direction of the connector accommodation portion 25. This configuration allows the gently sloping portions 32A to be formed on the upper portion of the cover plate portion 22. The gently sloping portions 32A can thus reliably catch the water that flows down over the cover plate portion 22 before the flow velocity increases. As a result, overflowing of the downward-flowing water from the ridge 32 can be reliably prevented.

Because the ends of the ridge 32 are continuous with the left and right side walls 61 and 62 of the connector accommodation portion 25, water that drops onto the ridge 32 is guided to the side walls 61 and 62 of the connector accommodation portion 25 and is drained off while avoiding the second through fourth connectors 17, 18, and 19. Penetration of water into the second through fourth connectors 17, 18, and 19 can thus be prevented.

Other Illustrative Aspects

The scope of the present invention is not limited to the illustrative aspects explained by descriptions and drawings above. For example, the illustrative aspects below are included within the technical scope of the present invention.

(1) In the first illustrative aspect above, the sloping wall 64 is formed such that roughly the center of the overhead wall 60 in the left-right direction serves as a vertex and the sloping wall 64 slopes in downward gradients from the vertex toward its left and right ends. However, the present invention is not limited to this configuration. For example, the right end of the sloping wall 64 may be the highest portion, and the left end may be the lowest portion, such that the downward gradient runs from right to left. Conversely, the left end may be the highest portion, and the right end may be the lowest portion, such that the downward gradient runs from left to right.

(2) In the illustrative aspects above, of the lower ends of the side faces on the outer sides of the connector accommodation portion 25 in the width direction, the lower end of the right side face in FIG. 3 is provided with the overhanging portion 66. However, the present invention is not limited to this configuration. A configuration in which the overhanging portion 66 is provided at the lower end of the left side in FIG. 3 may also be used. A configuration in which overhanging portions 66 are provided at both lower ends on the outer sides of the connector accommodation portion 25 in the width direction may also be used. The overhanging portion 66 may also be omitted where a lower end of a side face on an outer side of the connector accommodation portion 25 in the width direction can be separated from an opening edge portion of a connector.

(3) In the illustrative aspects above, the upper face of the ridge 32 serves as the sloping face 33 as a result of the sloping of the ridge 32 itself, but a slope may be imparted to the upper face only, without sloping the ridge 32 itself.

(4) In the illustrative aspects above, the ends of the ridge 32 are continuous with the left and right side faces of the connector accommodation portion 25, but the ends of the ridge 32 may be separated from the connector accommodation portion 25.

(5) In the illustrative aspects above, the sloping face 33 is formed such that roughly the center of the ridge 32 in the left-right direction serves as a vertex and the sloping face 33 slopes in downward gradients from the vertex toward its left and right ends. However, the present invention is not limited to this configuration. For example, the right end of the sloping face 33 may be the highest portion, and the left end may be the lowest portion, such that the downward gradient runs from right to left. Conversely, the left end may be the highest portion, and the right end may be the lowest portion, such that the downward gradient runs from left to right.

(6) In the illustrative aspects above, the ridge 32 is provided on the obverse face of the cover 14, but the position in which the ridge 32 is provided is not limited by the illustrative aspects above. For example, where the case is configured from a main portion that has a bottom and a cover portion that covers an opening in the main portion, the ridge 32 may be provided on the outer side of the bottom wall of the main portion.

What is claimed is:

1. An electrical connection box that includes a circuit board inside a case that has a side wall, comprising:
   a connector provided with an opening facing downward toward a bottom side of the case; and
   a sloping wall that is formed on an outer surface of the side wall such that it has a length dimension in the left-right direction that is greater than the width dimension of the connector and spans the entire width of the connector and that slopes downward toward at least one of two ends of the connector in the width direction.

2. The electrical connection box according to claim 1, wherein the sloping wall is formed such that roughly the center position of the connector in the width direction serves as a vertex and the sloping wall slopes in downward gradients from the vertex toward both sides of the connector in the width direction.

3. The electrical connection box according to claim 2, wherein
   an accommodation portion is formed in a side wall of the case such that the accommodation portion bulges to the outside of the case, has an overhead wall, and forms a space to include the connector; and
   the sloping wall is formed in the overhead wall of the accommodation portion.

4. The electrical connection box according to claim 3, wherein
   the accommodation portion, that forms a space to include the connector, is formed in a side wall of the case such that the accommodation portion bulges to the outside of the case; and
   the two ends of the sloping wall that is formed on the outer face of the side wall are continuous with the side faces on both sides of the accommodation portion in the width direction.

5. The electrical connection box according to claim 4, wherein
   a plurality of segments having different angles of inclination in relation to a horizon form the sloping wall, and each of the plurality of segments is continuous with a neighboring segment;
   the sloping wall segments with the greatest angle of inclination in relation to the horizon are continuous with the side faces on both sides of the accommodation portion in the width direction; and
   the sloping wall segments with angles of inclination smaller than the angle of inclination of the sloping walls with the greatest angle of inclination extend successively closer to roughly the center of the width direction of the connector accommodation portion.

6. The electrical connection box according to claim 5, wherein
   an overhanging portion that hangs downward is provided on a lower edge of at least one of the two ends of the accommodation portion in the width direction; and
   a lower edge of the overhanging portion is arranged lower than an opening edge portion of the connector.

7. The electrical connection box according to claim 6, wherein
   the connector is electrically connected to the circuit board.

8. The electrical connection box according to claim 7, wherein
   the case is flat in shape; and
   the case is arranged vertically such that the board plane of the circuit board that is positioned within the case is arranged roughly vertically.

9. The electrical connection box according to claim 8, wherein
   the electrical connection box is installed in a vehicle; and
   the electrical connection box controls the switching on and off of electric power to on-board electrical equipment.

10. The electrical connection box according to claim 1, wherein
an accommodation portion is formed in a side wall of the case such that the accommodation portion bulges to the outside of the case, has an overhead wall, and forms a space to include the connector; and
the sloping wall is formed in the overhead wall of the accommodation portion.

11. The electrical connection box according to claim 1, wherein
the accommodation portion, that forms a space to include the connector, is formed in a side wall of the case such that the accommodation portion bulges to the outside of the case; and
the two ends of the sloping wall that is formed on the outer face of the side wall are continuous with the side faces on both sides of the accommodation portion in the width direction.

12. The electrical connection box according to claim 2, wherein
the accommodation portion, that forms a space to include the connector, is formed in a side wall of the case such that the accommodation portion bulges to the outside of the case; and
the two ends of the sloping wall that is formed on the outer face of the side wall are continuous with the side faces on both sides of the accommodation portion in the width direction.

13. The electrical connection box according to claim 3, wherein
a plurality of segments having different angles of inclination in relation to a horizon form the sloping wall, and each of the plurality of segments is continuous with a neighboring segment;
the sloping wall segments with the greatest angle of inclination in relation to the horizon are continuous with the side faces on both sides of the accommodation portion in the width direction; and
the sloping wall segments with angles of inclination smaller than the angle of inclination of the sloping walls with the greatest angle of inclination extend successively closer to roughly the center of the width direction of the connector accommodation portion.

14. The electrical connection box according to claim 12, wherein
a plurality of segments having different angles of inclination in relation to a horizon form the sloping wall, and each of the plurality of segments is continuous with a neighboring segment;
the sloping wall segments with the greatest angle of inclination in relation to the horizon are continuous with the side faces on both sides of the accommodation portion in the width direction; and
the sloping wall segments with angles of inclination smaller than the angle of inclination of the sloping walls with the greatest angle of inclination extend successively closer to roughly the center of the width direction of the connector accommodation portion.

15. The electrical connection box according to claim 3, wherein
an overhanging portion that hangs downward is provided on a lower edge of at least one of the two ends of the accommodation portion in the width direction; and
a lower edge of the overhanging portion is arranged lower than an opening edge portion of the connector.

16. The electrical connection box according to claim 4, wherein
an overhanging portion that hangs downward is provided on a lower edge of at least one of the two ends of the accommodation portion in the width direction; and
a lower edge of the overhanging portion is arranged lower than an opening edge portion of the connector.

17. The electrical connection box according to claim 1, wherein
the connector is electrically connected to the circuit board.

18. The electrical connection box according to claim 1, wherein
the case is flat in shape; and
the case is arranged vertically such that the board plane of the circuit board that is positioned within the case is arranged roughly vertically.

19. The electrical connection box according to claim 1, wherein
the electrical connection box is installed in a vehicle; and
the electrical connection box controls the switching on and off of electric power to on-board electrical equipment.

* * * * *

UNITED STATES PATENT AND TRADEMARK OFFICE
CERTIFICATE OF CORRECTION

PATENT NO. : 7,357,650 B2  
APPLICATION NO. : 11/510700  
DATED : April 15, 2008  
INVENTOR(S) : Yoshikazu Sasaki and Yukinori Kita It is certified that error appears in the above-identified patent and that said Letters Patent is hereby corrected as shown below:

ON THE TITLE PAGE:

Please correct as follows:

Section (73) Assignees: Autonetworks Technologies, Ltd., Mie (JP);
Sumitomo Wiring Systems, Ltd., Mie (JP);
Sumitomo Electric Industries, ~~Inc.~~ Ltd., Osaka (JP)

Signed and Sealed this

Twenty-sixth Day of August, 2008

JON W. DUDAS  
*Director of the United States Patent and Trademark Office*